(12) United States Patent
Chen et al.

(10) Patent No.: US 11,996,345 B2
(45) Date of Patent: May 28, 2024

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Chih-Hao Chen, Taipei (TW); Po-Yuan Cheng, Hsinchu (TW); Pu Wang, Hsinchu (TW); Li-Hui Cheng, New Taipei (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 244 days.

(21) Appl. No.: 17/458,600

(22) Filed: Aug. 27, 2021

(65) Prior Publication Data

US 2023/0065884 A1 Mar. 2, 2023

(51) Int. Cl.

| | |
|---|---|
| *H01L 23/367* | (2006.01) |
| *H01L 21/48* | (2006.01) |
| *H01L 21/56* | (2006.01) |
| *H01L 21/683* | (2006.01) |
| *H01L 21/78* | (2006.01) |
| *H01L 23/00* | (2006.01) |
| *H01L 23/29* | (2006.01) |

(Continued)

(52) U.S. Cl.
CPC ...... *H01L 23/3675* (2013.01); *H01L 21/4882* (2013.01); *H01L 21/565* (2013.01); *H01L 21/568* (2013.01); *H01L 21/6836* (2013.01); *H01L 21/78* (2013.01); *H01L 23/295* (2013.01); *H01L 23/3185* (2013.01);
(Continued)

(58) Field of Classification Search
CPC ............. H01L 23/3675; H01L 23/295; H01L 23/3185; H01L 23/5383; H01L 23/5386; H01L 23/5389; H01L 23/5385; H01L 21/4882; H01L 21/565; H01L 21/568; H01L 21/6836; H01L 21/78; H01L 25/0652; H01L 25/50; H01L 25/0655; H01L 25/16; H01L 2221/68331; H01L 2224/214; H01L 2225/06558; H01L 2225/06589; H01L 2225/06513;
(Continued)

(56) References Cited

U.S. PATENT DOCUMENTS 8,993,380 B2 3/2015 Hou et al.
9,281,254 B2 3/2016 Yu et al.
(Continued)

*Primary Examiner* — Kyoung Lee
*Assistant Examiner* — Christina A Sylvia
(74) *Attorney, Agent, or Firm* — JCIPRNET

(57) ABSTRACT

A package structure includes a first semiconductor die, a first insulating encapsulation, a thermal coupling structure, and a heat dissipating component thermally coupled to the first semiconductor die through the thermal coupling structure. The first semiconductor die includes an active side, a rear side, and a sidewall connected to the active side and the rear side. The first insulating encapsulation extends along the sidewall of the first semiconductor die and includes a first side substantially leveled with the active side, a second side opposite to the first side, and topographic features at the second side. The thermal coupling structure includes a metallic layer overlying and the rear side of the first semiconductor die and the topographic features of the first insulating encapsulation. A manufacturing method of a package structure is also provided.

20 Claims, 13 Drawing Sheets

(51) Int. Cl.
*H01L 23/31* (2006.01)
*H01L 23/538* (2006.01)
*H01L 25/00* (2006.01)
*H01L 25/065* (2023.01)

(52) U.S. Cl.
CPC ...... *H01L 23/5383* (2013.01); *H01L 23/5386* (2013.01); *H01L 23/5389* (2013.01); *H01L 24/20* (2013.01); *H01L 25/0652* (2013.01); *H01L 25/50* (2013.01); *H01L 2221/68331* (2013.01); *H01L 2224/214* (2013.01); *H01L 2225/06558* (2013.01); *H01L 2225/06589* (2013.01); *H01L 2924/1715* (2013.01)

(58) Field of Classification Search
CPC . H01L 2225/06517; H01L 2225/06524; H01L 2225/06541; H01L 2924/1715
See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2017/0047264 | A1* | 2/2017 | Im ................ H01L 23/3736 |
| 2017/0062383 | A1* | 3/2017 | Yee ................ H01L 23/3675 |
| 2018/0358298 | A1* | 12/2018 | Zhai ................ H01L 25/0655 |
| 2019/0074264 | A1* | 3/2019 | Chen ................ H01L 23/5385 |
| 2019/0341351 | A1* | 11/2019 | May ................ H01L 24/25 |
| 2019/0393121 | A1* | 12/2019 | Swaminathan ....... H01L 23/367 |
| 2021/0202455 | A1* | 7/2021 | Tsai ................ H01L 25/0655 |

* cited by examiner

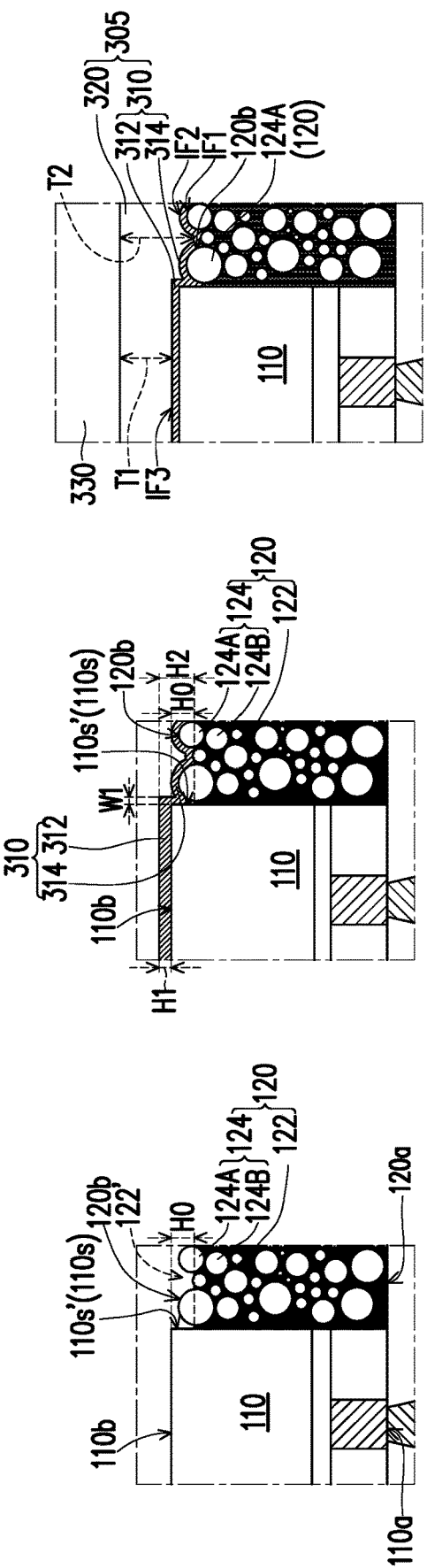

PACKAGE STRUCTURE AND MANUFACTURING METHOD THEREOF

BACKGROUND

As electronic products are continuously miniaturized, heat dissipation and warpage of a package structure have become the important issues for packaging technology. For example, a package structure includes a thermal conductive structure disposed between the back side of the semiconductor die and the lid. In such arrangement, thermal cycling can induce stress in the package structure, which can cause delamination and cracking, possibly leading to catastrophic failures. As a result, there is continuous effort in developing new mechanisms of forming package structures with better reliability and performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a schematic and enlarged view of a dashed box A in FIG. 1E in accordance with some embodiments.

FIG. 2B is a schematic and enlarged view of a dashed box B in FIG. 1H in accordance with some embodiments.

FIG. 2C is a schematic and enlarged view of a dashed box C in FIG. 1I in accordance with some embodiments.

DETAILED DESCRIPTION

Figure 1A:
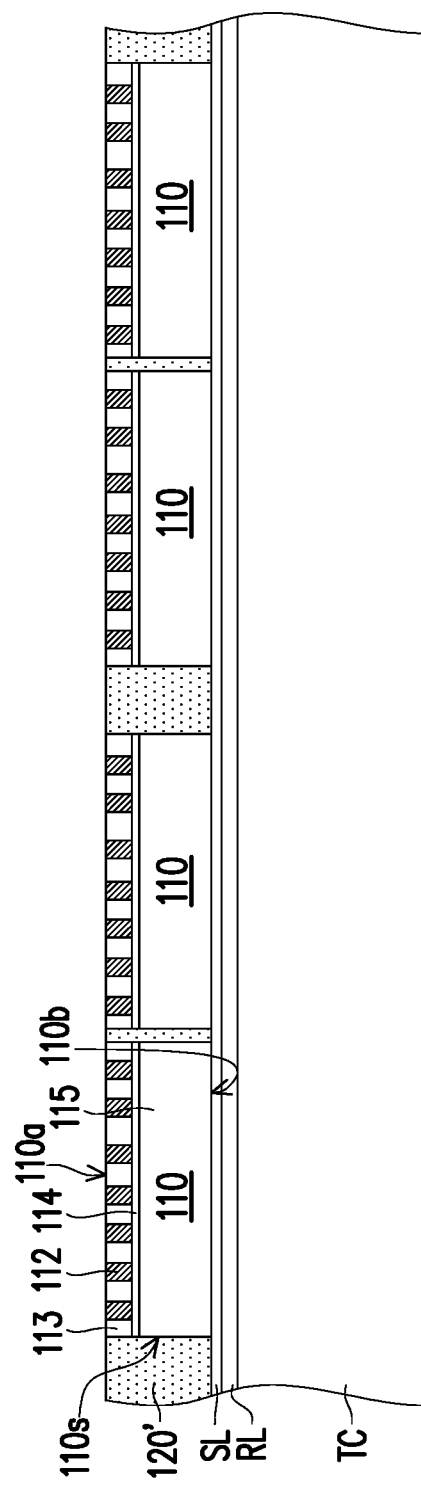
FIGS. 1A-1I are schematic cross-sectional views of various stages of manufacturing a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1I are schematic cross-sectional views of various stages of manufacturing a package structure in accordance with some embodiments. FIGS. 2A, 2B, and 2C are schematic and enlarged views of dashed boxes respectively in FIG. 1E, FIG. 1H, and FIG. 1I, in accordance with some embodiments.

Referring to FIG. 1A, a plurality of first semiconductor dies 110 may be disposed over a temporary carrier TC and laterally covered by an insulating encapsulation material 120'. The temporary carrier TC may be a glass carrier, a ceramic carrier, a composite carrier, and/or the like. In some embodiments, the temporary carrier TC is provided in a wafer form, and multiple first semiconductor dies 110 may be arranged in an array over the temporary carrier TC. In some embodiments, a release layer RL is formed on the temporary carrier TC to facilitate the removal of the temporary carrier TC that will be performed in subsequent steps. For example, the release layer RL includes a polymer-based material which may lose its adhesive property when heated. The release layer RL may include any suitable de-bonding material such as light-to-heat-conversion (LTHC) release material, ultra-violet (UV) glue, temporary adhesive, and/or the like.

In some embodiments, a sacrificial layer SL is interposed between the release layer RL and the first semiconductor dies 110. The sacrificial layer SL may be any suitable polymeric material, such as die attach film (DAF), adhesive, epoxy, or the like. The respective first semiconductor die 110 may include a first side 110a, a second side 110b opposite to the first side 110a, and a sidewall 110s connected to the first side 110a and the second side 110b. In some embodiments, the sacrificial layer SL is at the second side 110b of the respective first semiconductor die 110, and the respective first semiconductor die 110 may be attached to the release layer RL through the sacrificial layer SL. In some embodiments, the sacrificial layer SL is formed on the release layer RL before placement of the first semiconductor dies 110.

The respective first semiconductor die 110 may have a single function (e.g., a logic die, a processor die (e.g., a central processing unit (CPU) die, a graphics processing unit (GPU) die, an application-specific integrated circuit (ASIC) die, etc.), a memory die (e.g., a dynamic random-access memory (DRAM) die, a static random-access memory (SRAM) die, a stacked memory module, a high-bandwidth memory (HBM) die, etc.), a radio frequency die, a mixed signal die, a I/O die, combinations thereof, and/or the like). In some embodiments, the first semiconductor die(s) 110 may trap heat and become hot spot(s) in the resulting package structure. For example, the first semiconductor dies 110 are formed in a device wafer (not shown) which includes different die regions that are singulated to form a plurality of first semiconductor dies. After the singulation, the first semiconductor dies 110 are disposed over the release layer RL through a pick-and-place process. In some embodiments, the first semiconductor dies 110 are of different sizes (e.g., footprint areas) and have different functions. For example, at least one of the first semiconductor dies 110 may be formed as a die stack having multiple functions (e.g., a system-on-chip or the like). For example, the first semiconductor die 110 includes an interface module which bridges the processor module to memory module and translates commands therebetween. Alternatively, the first semiconductor dies 110 may be of the same/similar dimension(s). Other types of semiconductor dies may be used depending on product requirements.

With continued reference to FIG. 1A, the first semiconductor die 110 includes a plurality of die connectors 112 (e.g., micro-bumps, metal pillars with or without caps, controlled collapse chip connection (C4) bumps, or the like) distributed at the first side 110a for further electrical connection. The respective first semiconductor die 110 may (or may not) include a protection layer 113 covering the die connectors 112, an interconnecting layer 114 connected to the die connectors 112, and a semiconductor substrate 115 having active/passive devices (not shown) formed thereon. The interconnecting layer 114 may be formed over the semiconductor substrate 115 and electrically connect the die connectors 112 to the active/passive devices. The semiconductor substrate 115 may be referred to as a semiconductor material(s) including, but not limited to, bulk silicon, a silicon germanium substrate, silicon-on-insulator (SOI) substrate, or the like. Other semiconductor materials including group III, group IV, and group V elements may be used. It is noted that the configuration and the number of the first semiconductor dies 110 shown herein is merely for illustrative purposes, and any configuration and number of the first semiconductor dies may be employed depending on product requirements.

Still referring to FIG. 1A, the insulating encapsulation material 120' is formed over the temporary carrier TC and extends along the sidewall 110s of the respective first semiconductor die 110. In some embodiments, the insulating encapsulation material 120' is a mixture of a polymer-based material and fillers (or other additives). For example, the insulating encapsulation material 120' includes epoxy, epoxy with fillers (e.g., the particles of $SiO_2$, $Al_2O_3$, $TiO_2$, and/or the like), organic cylinders, plastic molding compound, plastic molding compound with fiber, or other suitable material. The detailed contents of the insulating encapsulation material 120' may be described later in accompanying with the enlarged view of FIG. 2A.

In some embodiments, an insulating material is formed on the sacrificial layer SL such that the first semiconductor dies 110 are buried (or covered). The insulating material may be formed by compression molding, transfer molding, injection molding, spin-on coating, or the like. The insulating material may be applied in liquid or semi-liquid form and then subsequently cured. Subsequently, a planarization process may be performed on the insulating material to expose a least a portion of the die connectors 112 of the respective first semiconductor die 110. The planarization process may include chemical-mechanical polishing (CMP), grinding, etching, a combination thereof, and/or the like. In some embodiments, the planarization process also removes material of the protection layer 113 until the die connectors 112 are accessibly exposed. In some embodiments, after the planarization process, top surfaces of the protection layer 113, the die connectors 112, and the insulating encapsulation material 120' are substantially leveled (e.g., coplanar). Alternatively, the planarization process may be omitted.

Figure 1B:
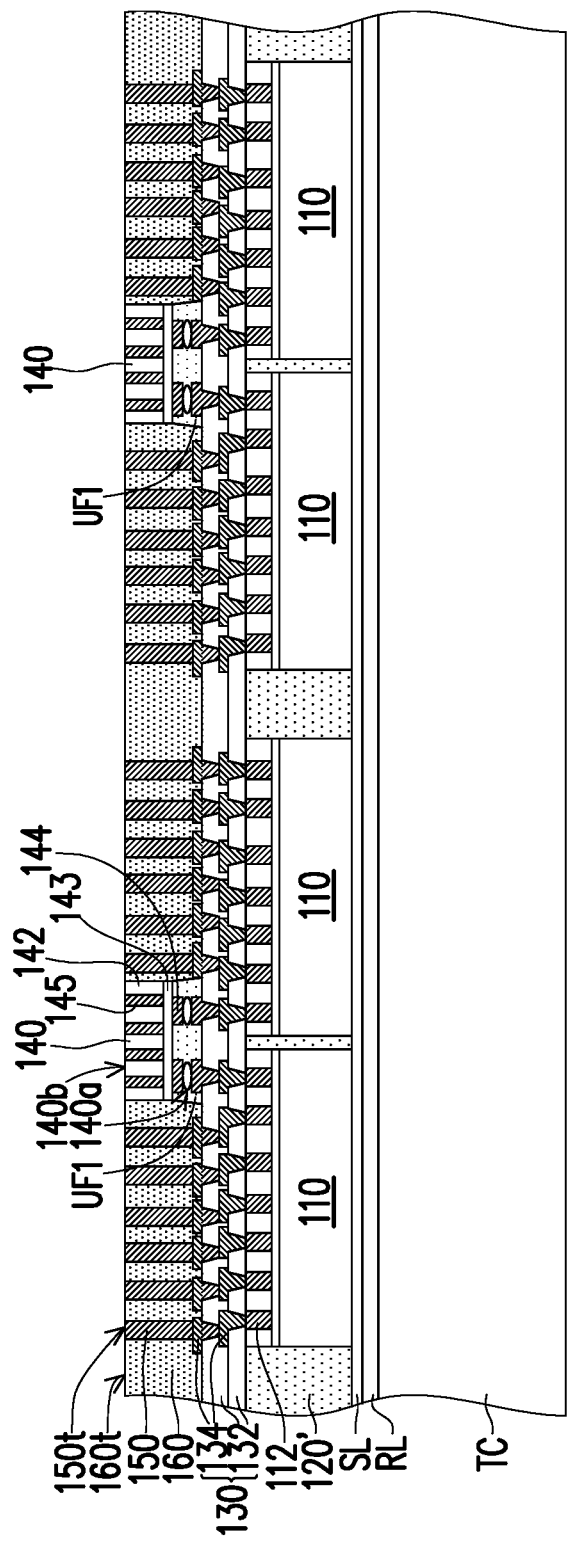

Referring to FIG. 1B, a first redistribution structure 130 may be formed on the first semiconductor dies 110 and the insulating encapsulation material 120'. The first redistribution structure 130 includes any number of alternately stacked patterned dielectric layers 132 and patterned conductive layers 134. The first redistribution structure 130 is shown as an example having two layers, but more or fewer patterned dielectric layers and patterned conductive layers may be formed in the first redistribution structure 130. The patterned dielectric layers 132 may be formed of a photosensitive material such as polybenzoxazole (PBO), polyimide (PI), benzocyclobutene (BCB), and/or the like. For example, the patterned dielectric layers 132 may be deposited by spin-coating, lamination, CVD, the like, or a combination thereof, and may be patterned by lithography and etching, or the like, to form openings for further electrical connection. The patterned conductive layers 134 may include a seed material and a conductive material (e.g., Cu, Ti, Al, Au, Ag, metal alloy, and/or the like) formed on the seed material. The respective patterned conductive layer 134 includes portions on and extending along the major surface of the underlying patterned dielectric layer 132, and also includes portions extending through the underlying patterned dielectric layer 132 to physically and electrically couple the underlying die connectors 112 or the underlying one of the patterned conductive layers 134. The patterned conductive layers 134 may be referred to as redistribution layers or redistribution lines.

With continued reference to FIG. 1B, a plurality of second semiconductor dies 140 may be disposed over the first redistribution structure 130. For example, the respective second semiconductor die 140 is picked and placed on the first redistribution structure 130 and located above a gap between adjacent first semiconductor dies 110. The adjacent first semiconductor dies 110 may be electrically interconnected through the first redistribution structure 130 and the second semiconductor die 140 disposed above these adjacent first semiconductor dies 110.

In some embodiments, the respective second semiconductor die 140 includes a semiconductor substrate 142, a connecting layer 143 disposed on the semiconductor substrate 142, die connectors 144 connected to the connecting layer 143, and through substrate vias (TSVs) 145 penetrating through the semiconductor substrate 142 and connected to the connecting layer 143. The side where the die connectors 144 are distributed may be referred to as the front side 140a of the respective second semiconductor die 140. The second semiconductor dies 140 may be disposed in a flip-chip manner. For example, after disposing the second semiconductor die 140, the front side 140a of the second semiconductor die 140 is connected to the uppermost one of the patterned conductive layers 134 and faces toward the first semiconductor dies 110. In some embodiments, the connecting layer 143 includes a wide variety of active devices and/or passive device(s). In some embodiments, the second semiconductor die 140 is referred to as a bridge die for a shorter electrical connection path between the adjacent first semiconductor dies 110. For example, the second semiconductor die 140 is free of active and/or passive device(s).

In some embodiments, a first underfill layer UF1 is formed between the first redistribution structure 130 and the respective second semiconductor die 140. For example, a liquid organic material (e.g., epoxy mixture) is dispensed into the gap between the second semiconductor die 140 and the first redistribution structure 130, and then a curing process is performed to form the first underfill layer UF1. The first underfill layer UF1 may cover the die connectors 144 of the second semiconductor die 140 and the patterned conductive layer 134, thereby strengthening the attachment and helping to prevent the thermal stresses from breaking the connection therebetween. Alternatively, the first underfill layer UF1 is omitted.

With continued reference to FIG. 1B, a plurality of through vias 150 may be formed over the first redistribution structure 130 and surrounds the respective second semiconductor die 140. The through vias 150 may include any suitable conductive material (e.g., Cu, Ti, Ni, Sn, metal alloy, a combination thereof, or the like). The through vias 150 may be formed before (or after) placement of the second semiconductor dies 140. In some embodiments, the method of forming the through vias 150 includes the following steps. A photoresist layer with openings (not shown) is formed on the first redistribution structure 130, and the openings of the photoresist layer may expose the intended locations of the patterned conductive layer 134 for the subsequently formed conductive material. Subsequently, a plating process or any suitable deposition process is performed to form a conductive layer (e.g., a copper-containing layer) in the openings of the photoresist layer, and then the photoresist layer is removed. The through vias 150 are then remained on the first redistribution structure 130. The through vias 150 may be electrically coupled to the first semiconductor dies 110 through the patterned conductive layers 134 of the first redistribution structure 130. It is appreciated that the number and the locations of the through vias 150 are variable and may be modified in demand.

Still referring to FIG. 1B, a second insulating encapsulation 160 may be formed on the first redistribution structure 130 and laterally covers the through vias 150, the second semiconductor dies 140, and the first underfill layer UF1. The material and the forming process of the second insulating encapsulation 160 may be the same as or similar to those of the insulating encapsulation material 120'. For example, after the planarization process, top surfaces 150t of the through vias 150, top surfaces of TSVs 145 at rear sides 140b of the second semiconductor dies 140, and a top surface 160t of the second insulating encapsulation 160 are substantially leveled (e.g., coplanar) within process variations.

Figure 1C:
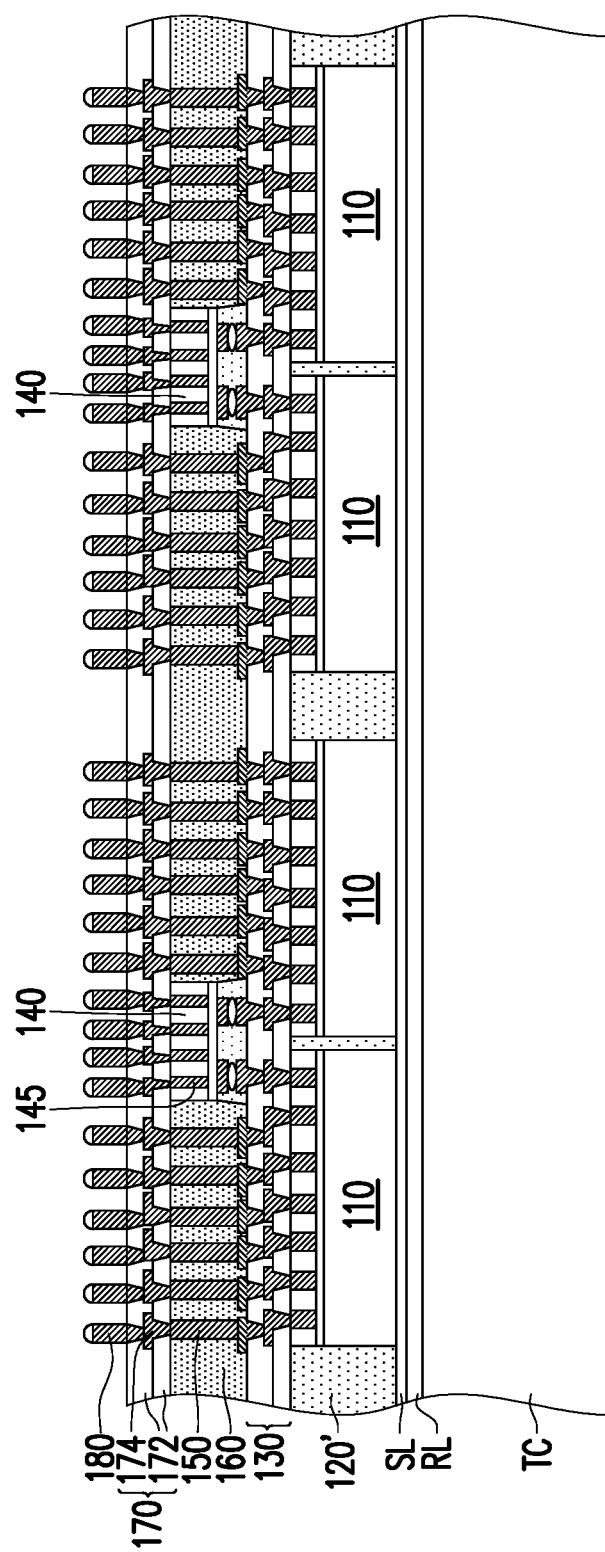

Referring to FIG. 1C, a second redistribution structure 170 may be formed on the through vias 150, the second semiconductor dies 140, and the second insulating encapsulation 160. The second redistribution structure 170 may include any number of alternately stacked patterned dielectric layers 172 and patterned conductive layers 174. The patterned conductive layers 174 may be electrically coupled to the TSVs 145 of the second semiconductor dies 140 and the through vias 150. The patterned conductive layers 174 may also be referred to as redistribution layers or redistribution lines. The materials and the forming processes of the second redistribution structure 170 may be similar to those of the first redistribution structure 130, so the detailed descriptions are not repeated for the sake of brevity.

In some embodiments, a plurality of conductive terminals 180 is formed on the second redistribution structure 170. The conductive terminals 180 may be or may include metal pillars, micro-bumps, controlled collapse chip connection (C4) bumps, solder balls, electroless nickel-electroless palladium-immersion gold (ENEPIG) bumps, ball grid array (BGA) connectors, or the like. In some embodiments, a method of forming the conductive terminals 180 may include at least the following steps. A mask layer (not shown) having a plurality of openings may be formed on the second redistribution structure 170. The openings of the mask layer may expose the intended locations of the second redistribution structure 170 for the subsequently formed conductive terminals 180. Next, a plating process (or any suitable deposition process) may be performed in the openings of the mask layer to form the pillar portions that have vertical sidewalls and are in physical and electrical contact with the underlying patterned conductive layer 174. Subsequently, a solder material may be formed on the pillar portions to form the cap portions using any suitable method (e.g., evaporation, plating, printing, solder transfer, ball placement, etc.). Afterwards, the mask layer is removed, and a reflow process is optionally performed on the solder material to shape into the desired bump shapes.

Figure 1D:
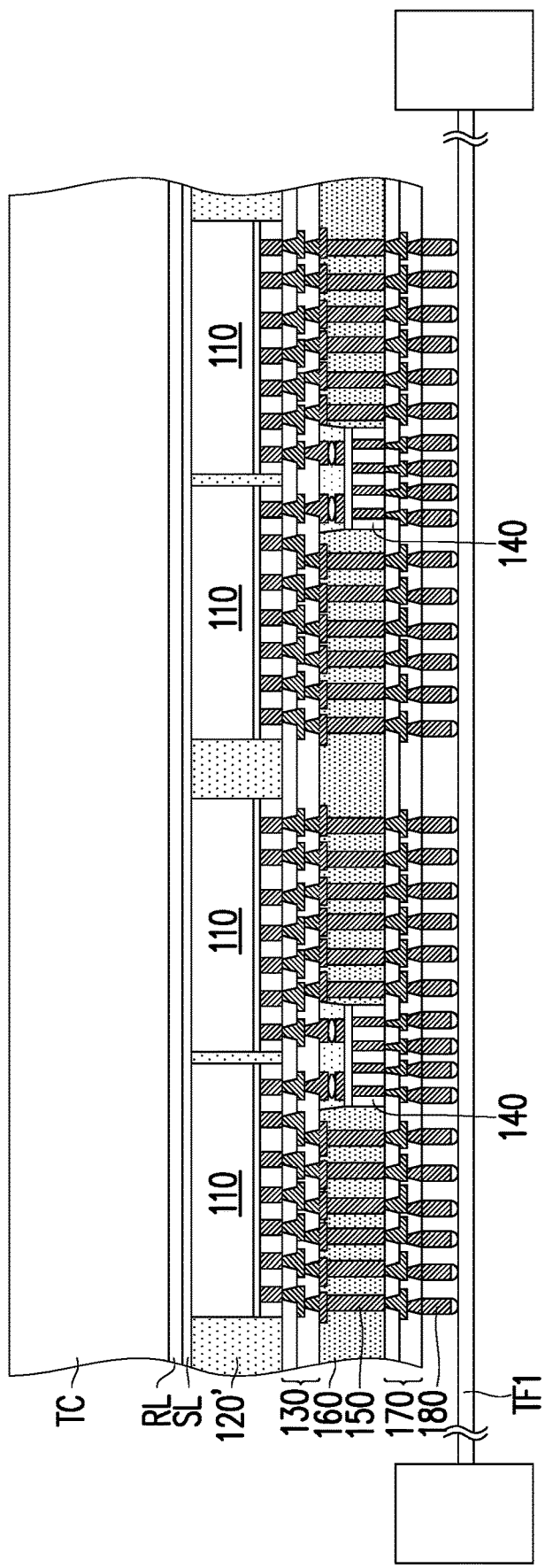
Figure 1E:
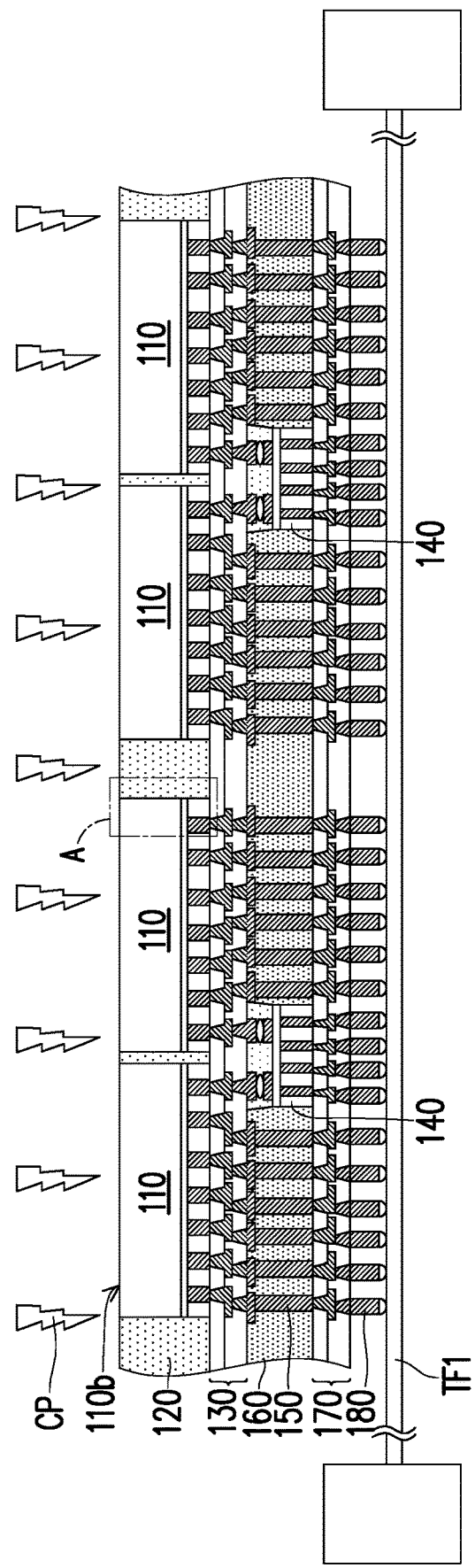

Referring to FIGS. 1D-1E and with reference to FIG. 1C, the resulting structure shown in FIG. 1C may be overturned (e.g., flipped upside down) and mounted on a tape frame TF1. For example, the conductive terminals 180 are attached to the tape of the tape frame TF1. Subsequently, the temporary carrier TC may be removed through a de-bonding process. It is understood that during the foregoing manufacturing process, the temporary carrier TC and the structure formed thereon has warpage due to coefficient of Thermal Expansion (CTE) mismatch. By mounting the resulting structure of FIG. 1C on the tape frame TF1 prior to the de-bonding process of the temporary carrier TC, negative impacts caused by the warpage during the de-bonding process may be reduced or eliminated.

For example, a light (e.g., laser or UV light) is projected on the release layer RL so that the release layer RL may decompose under the heat of the light and the temporary carrier TC and release layer RL may be removed. Afterwards, a cleaning process (represented in FIG. 1E by the mark labeled CP) is performed to remove the sacrificial layer SL and any remaining material of the release layer RL. In some embodiments, the cleaning process CP is a dry-cleaning process. For example, a plasma treatment is performed to remove polymer residues on the first semiconductor dies 110. In some embodiments, during the cleaning process CP, the major surface of the structure is exposed to plasma such as an oxygen containing plasma (e.g., including $O_2$, NO, $N_2O$, a mixed $O_2$ gas, etc.), a fluorocarbon containing plasma (e.g., including $CF_4$, $CHF_3$, $C_2F_6$, etc.), a nitrogen containing plasma (e.g., $N_2$, $N_2$/Ar, etc.), and/or the like, to etch any undesirable polymeric material on the second sides 110b of the first semiconductor dies 110. In some embodiments, during the dry-cleaning process, a portion of the polymeric material in the insulating encapsulation material 120' is also removed to form the first insulating encapsulation 120. After the plasma treatment, by-products formed on the treated surface, if any, may be cleaned away by applying suitable solution (e.g., deionized water, a mixture of deionized water, KOH, TMAH, DMSO, and/or the like) onto the treated surface. Other suitable cleaning technique(s) may be applied.

With continued reference to FIG. 1E and further referring to FIG. 2A, the first insulating encapsulation 120 includes a base layer 122 with a plurality of fillers 124. For example, the fillers 124 have various diameters (sizes). Alternatively, the fillers 124 may have uniform diameter. In some embodiments, the fillers 124 includes a first portion 124A partially embedded in the base layer 122 and a second portion 124B below the first portion 124A and fully embedded in the base layer 122. For example, during the cleaning process CP, a portion of the base material 122' is removed to accessibly expose upper part of the fillers (i.e. the first portion 124A).

The base material 122' in FIG. 2A is shown in the dashed line to represent it has been removed.

Still referring to FIG. 2A, the first insulating encapsulation 120 includes a first side 120a, a second side 120b opposite to and rougher than the first side 120a, and topographic features (e.g., the first portion 124A) distributed at the second side 120b. The removal of the base material 122' may make the second side 120b of the first insulating encapsulation 120 uneven and rough, due to the first portion 124A of the fillers 124 protruded from the base layer 122. In some embodiments, due to the removal of the base material 122', a portion 110s' of the sidewall 110s is accessibly exposed by the first insulating encapsulation 120. For example, the portion 110s' has a vertical dimension H0 (e.g., the height of the length) measured from the second side 110b to the top surface of the base layer 122, and the vertical dimension H0 is non-zero. For example, the second side 110b of the first semiconductor die 110 is higher than the second side 120b of the first insulating encapsulation 120, relative to the reference plane on which the first side 110a of the first semiconductor die 110 is located.

With continued reference to FIG. 2A, the first side 120a of the first insulating encapsulation 120 is substantially leveled (e.g., coplanar) with the first side 110a of the first semiconductor die 110. The second side 120b of the first insulating encapsulation 120 may be non-coplanar with the second side 110b of the first semiconductor die 110. In some embodiments, the second side 110b of the first semiconductor die 110 may be a substantially flat surface, and the second side 120b of the first insulating encapsulation 120 may be rougher than the second side 110b of the first semiconductor die 110. As surface roughness is known that provides a measure of the unevenness of the surface height. For example, the average surface roughness of the second side 120b of the first insulating encapsulation 120 may be in the range of about 0.1 µm to about 5 µm. It is appreciated that the recited values are merely examples and may be changed to different values depending on the process and product requirements.

Figure 1F:
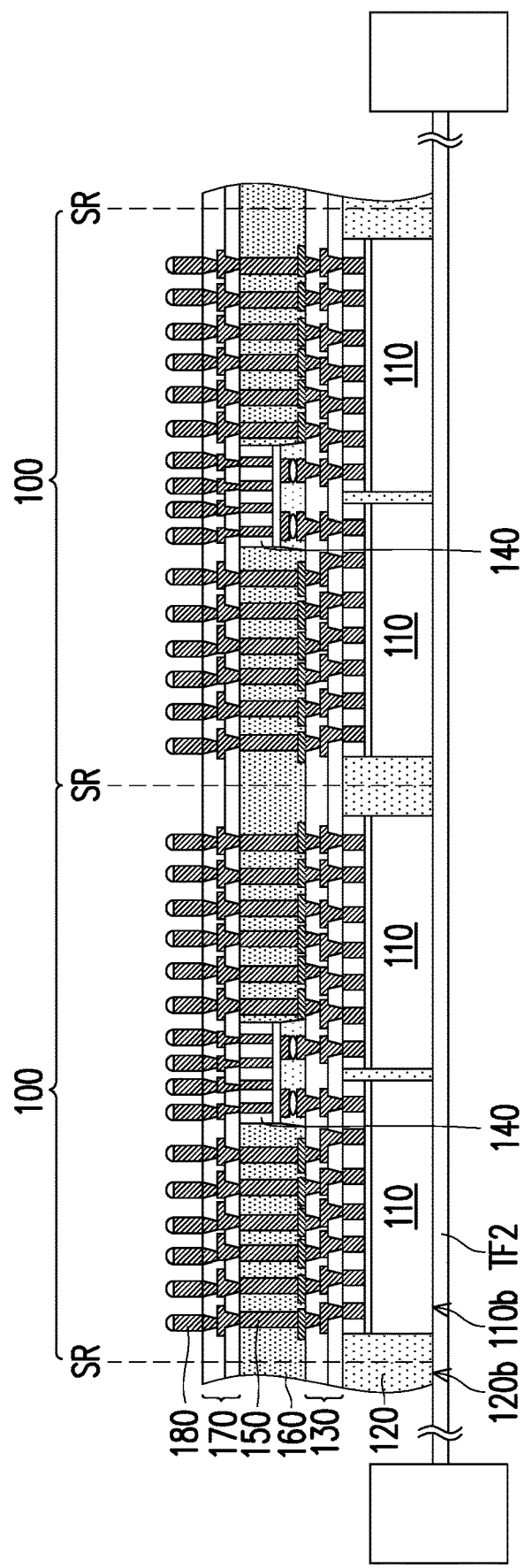

Referring to FIG. 1F and with reference to FIG. 1E, the resulting structure shown in FIG. 1E may be removed from the tape frame TF1 and then overturned (e.g., flipped upside down) to be mounted on a dicing tape frame TF2. For example, the second sides (110b and 120b) of the first semiconductor dies 110 and the first insulating encapsulation 120 are placed on the tape of the dicing tape frame TF2. The dicing tape frame TF2 may be similar to the tape frame TF1. After mounting on the dicing tape frame TF2, a singulation process may be performed by sawing along scribe line regions SR to separate first package components 100 from one another. For example, the sawing includes cutting off the second redistribution structure 170, the second insulating encapsulation 160, the first redistribution structure 130, and the first insulating encapsulation 120 to render a conterminous sidewall of the first package component 100 (as shown in FIG. 1G).

Figure 1G:
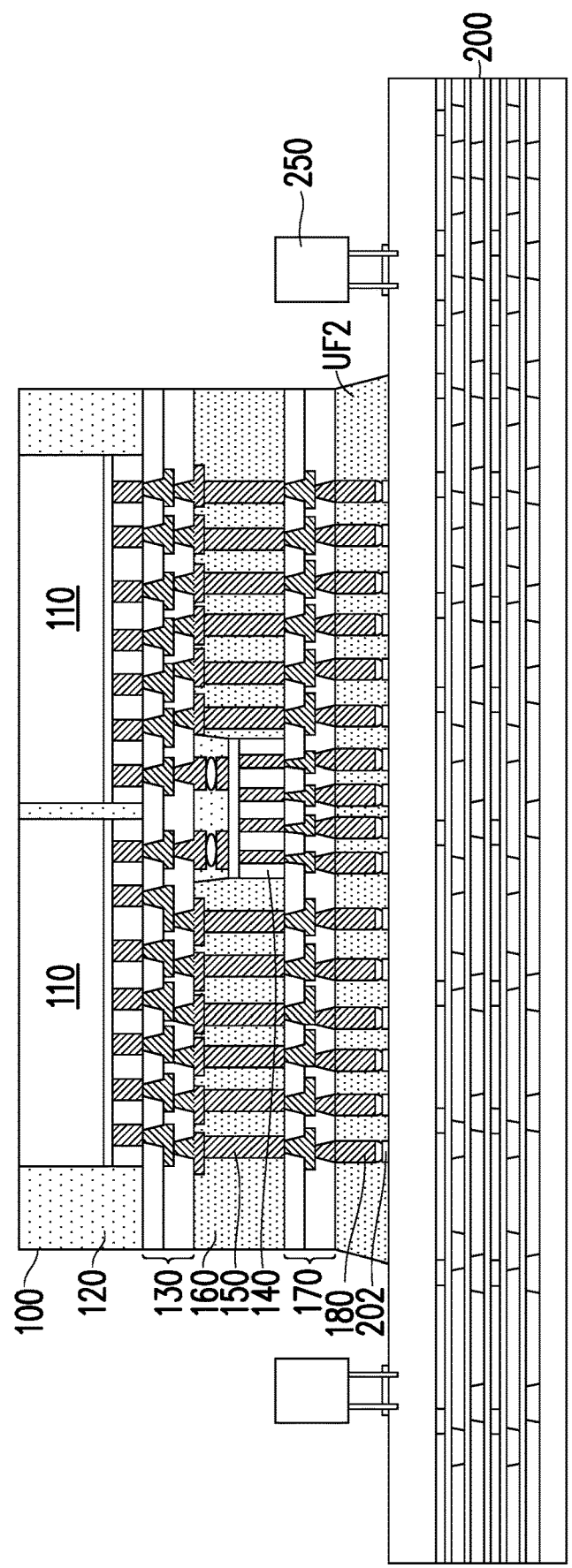

Referring to FIG. 1G, the first package component 100 may then be disposed on a second package component 200. For example, the conductive terminals 180 are placed on bond pads 202 of the second package component 200, and then a reflow process is performed to form conductive joints coupling the first package component 100 and the second package component 200. The first semiconductor dies 110 in the first package component 100 may be electrically coupled to the second package component 200 through the conductive joints. The second package component 200 may be or may include a printed circuit board (PCB), a package substrate, a silicon interposer, a silicon substrate, an organic substrate, a ceramic substrate, a combination thereof, and/or the like. It is noted that any circuit/redistributive substrate that provides support and connectivity are fully intended to be included within the scope of the embodiments.

In some embodiments, a second underfill layer UF2 is formed between the first package component 100 and the second package component 200 to surround the conductive joints, the conductive terminals 180, and the bond pads 202. The second underfill layer UF2 may be formed by a capillary flow process or any suitable deposition method. Alternatively, the second underfill layer UF2 is omitted. In some embodiments, at least one passive component 250 is mounted on the second package component 200 and disposed next to the first package component 100. It is noted that the number and the configuration of the passive components 250 shown in FIG. 1G are merely an example and construe no limitation in the disclosure.

Figure 1H:
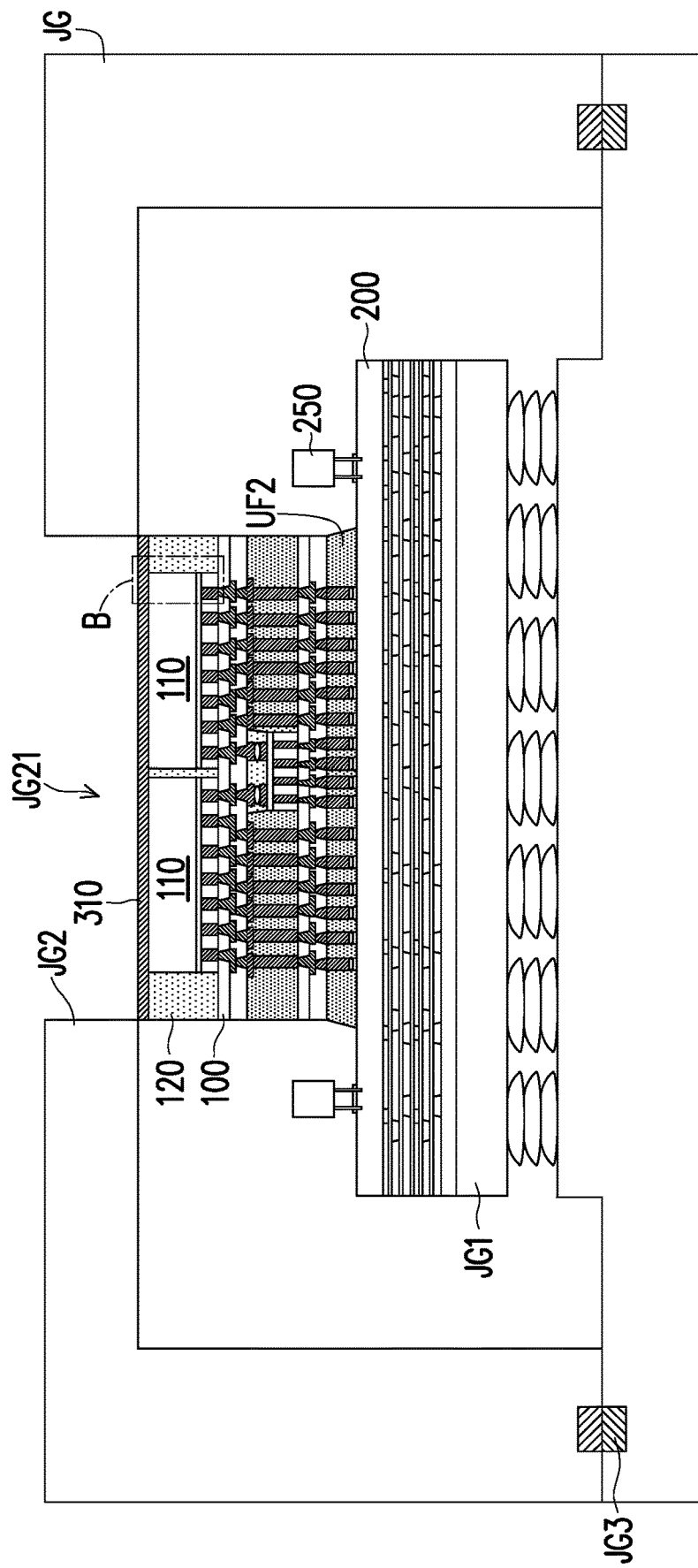

Referring to FIG. 1H and with reference to FIG. 1G, the resulting structure shown in FIG. 1G may be placed in a jig JG for processing on the first package component 100. For example, the second package component 200 is placed on a bottom portion JG1 of the jig JG, and then a cover portion JG2 with a window JG21 is engaged with the bottom portion JG1 by a suitable engaging mechanism JG3 (e.g., magnets, screws and bolts, etc.). For example, after the cover portion JG2 of the jig JG is disposed in place, the surface of the first package component 100 is accessibly exposed by the window JG21. Other components (e.g., the second package component 200, the passive component 250, and the second underfill layer UF2) may be shielded by the cover portion JG2. In some embodiments, the orthographic projection area of the window JG21 of the jig JG and the surface area of the exposed surface of the first package component 100 are substantially equal within process variations.

With continued reference to FIG. 1H and further referring to FIG. 2B, a metallic layer 310 may be formed on the surface of the first package component 100 that is accessibly exposed by the window JG21 of the cover portion JG2. For example, the metallic layer 310 includes any suitable conductive material (e.g., Al, Ti, TiN, Ni, NiV, Au, Ag, Cu, stainless steel, metal alloy, a combination thereof, and/or the like), and may be formed by any suitable process (e.g., sputtering, printing, plating, and/or the like). As shown in FIG. 2B, the metallic layer 310 may be deposited on the second side 110b of the first semiconductor die 110, the portion 110s' of the sidewall 110s of the first semiconductor die 110, and the second side 120b of the first insulting encapsulation 120, in accordance with some embodiments.

The metallic layer 310 may include a first portion 312 overlying the flat rear surface of the first semiconductor die 110 and extending to cover the portion 110s' of the sidewall 110s, and a second portion 314 substantially conforming to the surface topography of the first insulting encapsulation 120. In some embodiments, the thickness H1 of the first portion 312 is in a range of about 0.1 µm to about 10 µm. Deposition of the metallic layer 310 may be substantially conformal to the underlying topography and result in a rough surface topography of the second portion 314 and a smooth surface topography of the first portion 312. For example, the first portion 124A of the fillers 124 at the second side 120b may be partially embedded in the base layer 122, and the rest parts of the first portion 124A that are accessibly revealed by the base layer 122 may be covered by the metallic layer 310.

With continued reference to FIG. 2B, the sidewall 110s of the first semiconductor die 110 may have a major portion covered by the first insulating encapsulation 120 and a minor portion covered by the metallic layer 310. For example, the portion of the metallic layer 310 lining the portion 110s' of the sidewall 110s of the first semiconductor die 110 has a lateral dimension W1 (e.g., the thickness or the width), and the thickness H1 of the first portion 312 is substantially greater than the lateral dimension W1. In some embodiments, the lateral dimension W1 is in a range of about 0.05 μm to about 5 μm. Alternatively, the lateral dimension W1 is substantially equal to the thickness H1. In some embodiments, the portion of the metallic layer 310 lining the portion 110s' has a vertical dimension H2 (e.g., the height or the length) substantially greater than the vertical dimension H0. Alternatively, the vertical dimension H2 is substantially equal to the vertical dimension H0.

Figure 1I:
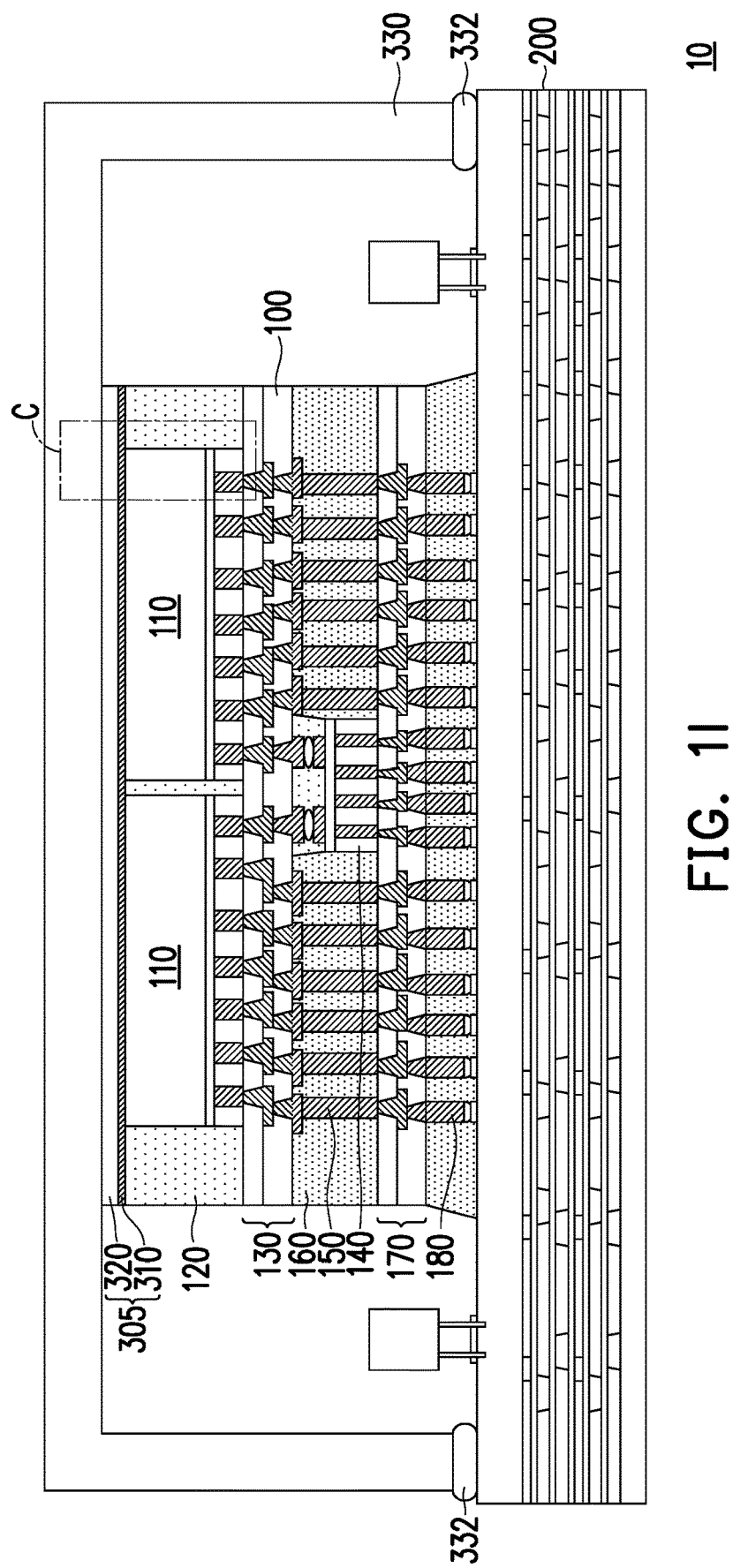

Referring to FIG. 1I and with reference to FIG. 1H, the resulting structure is released from the jig JG after the formation of the metallic layer 310, and then a thermal interface material (TIM) layer 320 may be formed over the first package component 100. Subsequently, a heat dissipating component 330 may be at least coupled to the first package component 100 to form a package structure 10. The heat dissipating component 330 may be formed from a material having a high thermal conductivity, such as steel, stainless steel, Cu, Al, a combination thereof, and/or the like. The heat dissipating component 330 may be a single continuous material or may include multiple pieces that are the same or different materials. For example, the heat dissipating component 330 is a lid that is attached to the first package component 100 through the TIM layer 320 and attached to the second package component 200 through an adhesive layer 332. Although the heat dissipating component 330 may be any tape of heat spreading mechanism which meets heat dissipation requirements of the package structure 10.

In some embodiments, the adhesive layer 332 and the TIM layer 320 are deposited on the second package component 200 and the metallic layer 310, respectively. The adhesive layer 332 may be an epoxy, a silicon resin, glue, or the like, and may (or may not) be capable of transferring heat. The adhesive layer 332 may be deposited at the intended location(s) to allow the heat dissipating component 330 to be attached around the first package component 100. For example, the adhesive layer 332 is formed around the perimeter of the second package component 200. The TIM layer 320 may facilitate the thermal coupling between the heat dissipating component 330 and the first package component 100. For example, the TIM layer 320 has a good thermal conductivity and may include a polymer with/without thermal conductive fillers. In some embodiments, the TIM layer 320 includes conductive materials (e.g., a metallic-based or solder-based material, or the like). In some embodiments, the TIM layer 320 includes a film-based or sheet-based material. In some embodiments, the TIM layer 320 and the adhesive layer 332 are of the same material and may (or may not) be formed at the same step. Alternatively, the TIM layer 320 may be applied after (or before) the adhesive layer 332.

With continued reference to FIG. 1I and further referring to FIG. 2C, the first portion 312 of the metallic layer 310 is interposed between the TIM layer 320 and the first semiconductor die 110, and the second portion 314 of the metallic layer 310 is interposed between the TIM layer 320 and the first portion 124A of the first insulating encapsulation 120. In some embodiments, a thickness T1 of a portion of the TIM layer 320 that is above the first semiconductor die 110 is substantially less than a thickness T2 of another portion of the TIM layer 320 that is above the first insulating encapsulation 120. In some embodiments, the interface IF2 between the second portion 314 of the metallic layer 310 and the TIM layer 320 substantially conforms to the interface IF1 between the second side 120b of the first insulating encapsulation 120 and the second portion 314 of the metallic layer 310. For example, the interface IF2 between the second portion 314 and the TIM layer 320 is rougher than the interface IF3 between the first portion 312 and the TIM layer 320. It should be understood that the surface topography of the metallic layer may change depending on the thickness of the metallic layer, and the variation thereof will be discussed in accompanying with FIG. 3. In some embodiments, the metallic layer 310 and the TIM layer 320 are collectively viewed as a thermal coupling structure 305 that thermally couples the heat dissipating component 330 to the first package component 100. The thermal coupling structure 305 provides good adhesion and prevents interfacial delamination at the interfaces of the overlying heat dissipating component 330 and the underlying first package component 100.

Figure 3B:
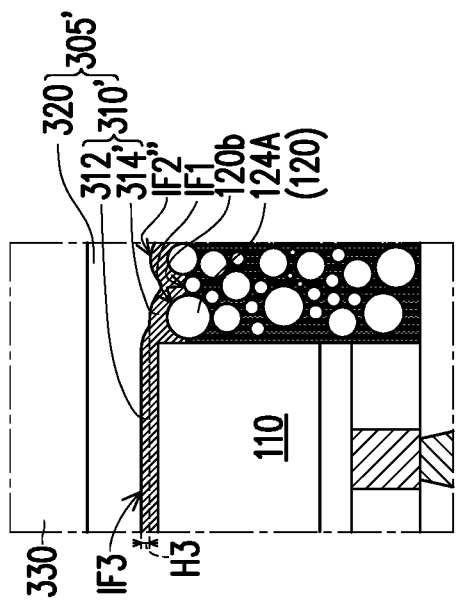
FIGS. 3A and 3B are schematic and enlarged views of a dashed box C in FIG. 1I in accordance with some other embodiments.
Figure 3A:
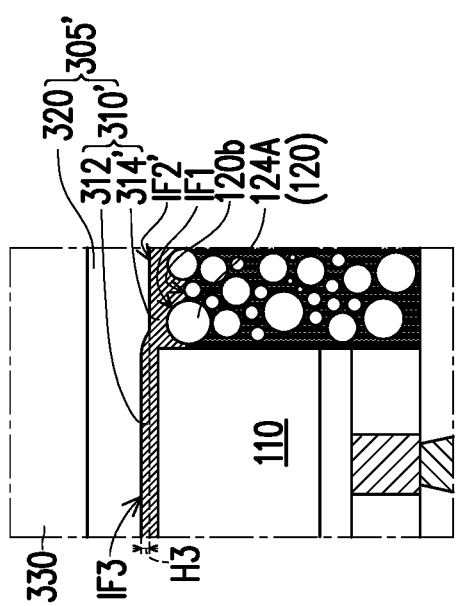

FIGS. 3A and 3B are schematic and enlarged views of a dashed box C in FIG. 1I in accordance with some other embodiments. The structure shown in FIGS. 3A and 3B may be similar to the structure shown in FIG. 2C, like reference numbers are used to designate like elements, and the detailed descriptions may be omitted for the sake of brevity. Referring to FIG. 3A and with reference to FIG. 2C, the difference between these two structures lies in the metallic layer 310' of the thermal coupling structure 305'.

As shown in FIG. 3A, the interface IF2' between the second portion 314' of the metallic layer 310' and the TIM layer 320 may not conform to the interface IF1 between the second side 120b of the first insulating encapsulation 120 and the second portion 314' of the metallic layer 310'. The interface IF2' may be smoother than the interface IF2 shown in FIG. 2C and may be relatively flat as compared to the interface IF2. For example, the interface IF1 is substantially rougher than the interface IF2'. In some embodiments, the interface IF2' is non-coplanar with the interface IF3 between the first portion 312 and the TIM layer 320. In some embodiments, a curved (or sloped) surface is formed at the intersection between the interfaces IF2' and IF3. In some embodiments, the interface IF3 and the interface IF2' forms a step, and a step height H3 therebetween is non-zero. Alternatively, the step height may approach zero, depending on the forming method and the thickness of the metallic layer.

As shown in FIG. 3B and with reference to FIG. 3A and FIG. 2C, the interface IF2" between the second portion 314' of the metallic layer 310' and the TIM layer 320 is not as smooth as the interface IF2' in FIG. 3A. For example, the interface IF2" between the second portion 314' of the metallic layer 310' slightly conforms to the surface topography of the second side 120b of the first insulating encapsulation 120. In some embodiments, the surface flatness of the interface IF2" is better than the surface flatness of the interface IF1 but worse than the surface flatness of the interface IF3. It should be noted that the structures shown in FIGS. 3A and 3B are merely examples, and that variations thereof may be carried out while still remaining within the scope of the claims and disclosure.

Figure 4A:
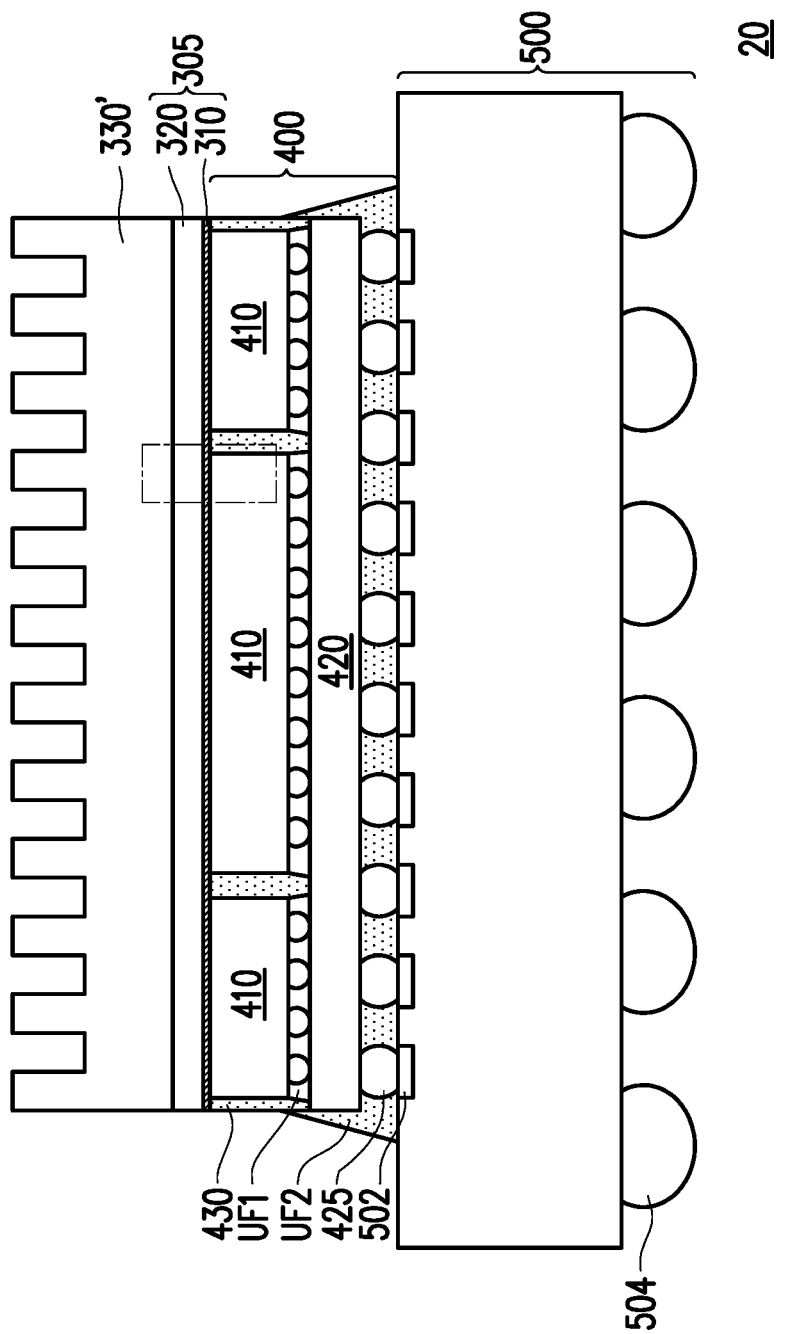
FIGS. 4A and 4B are schematic cross-sectional views of a package structure in accordance with some embodiments.
Figure 4B:
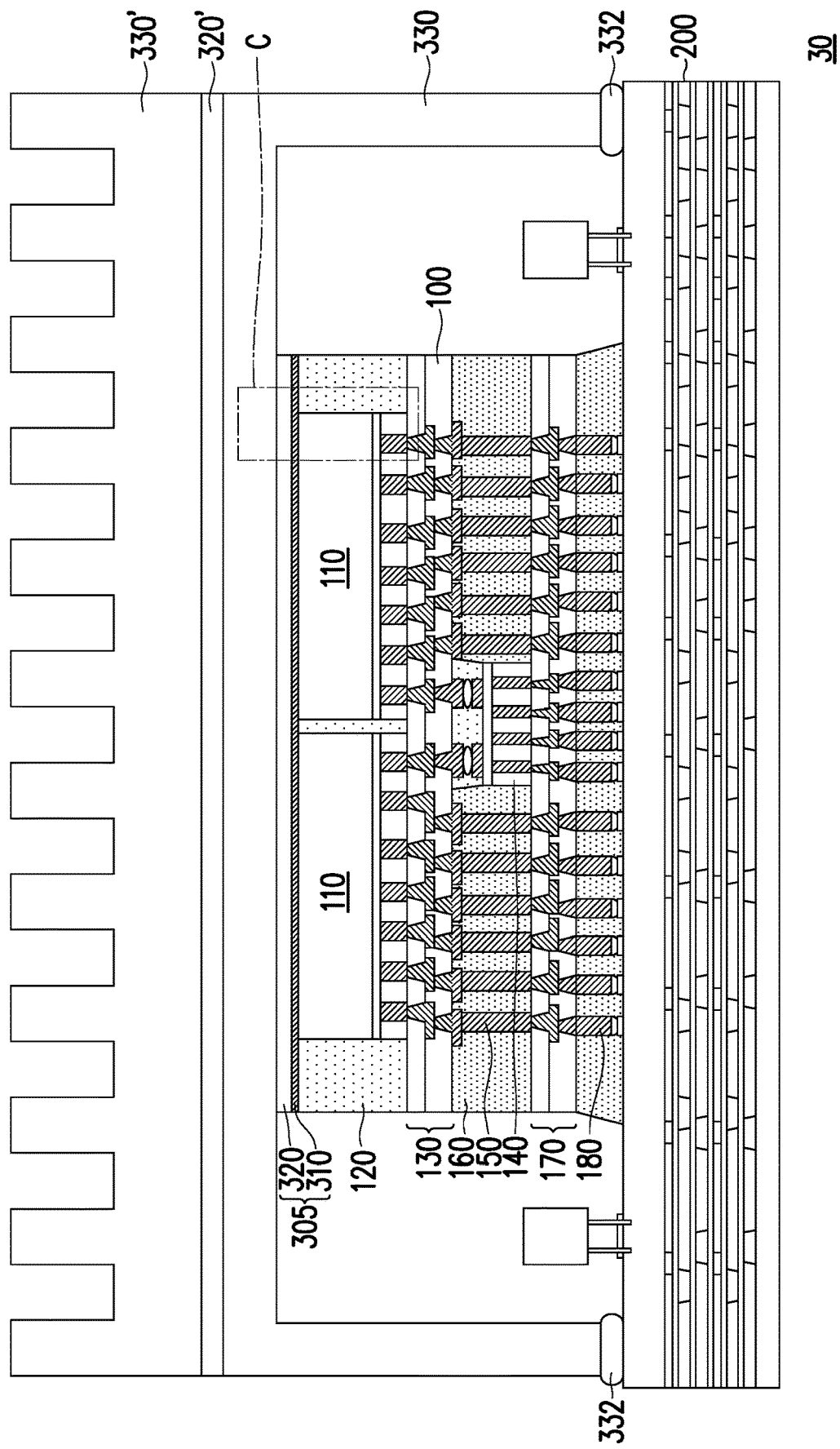

FIGS. 4A and 4B are schematic cross-sectional views of a package structure in accordance with some embodiments. Unless specified otherwise, the materials and the formation methods of the components in these embodiments are essentially the same as the like components, which are denoted by like reference numerals in the embodiments in preceding paragraphs. Referring to FIG. 4A, a package structure 20 may include a first package component 400, a second package component 500 electrically coupled to the first package component 400, the thermal coupling structure 305 disposed on the first package component 400, and a heat dissipating component 330' thermally coupled to the first package component 400 through the thermal coupling structure 305. For example, the package structure 20.

In some embodiments, the first package component 400 is formed by bonding various semiconductor dies 410 to an interposer 420. The semiconductor dies 410 may be similar to the semiconductor dies 110 described in FIG. 1A, or may be integrated circuit (IC) die stacks having a single function (e.g., logic IC, memory IC, etc.) or multiple functions (e.g., a system-on-chip). The semiconductor die(s) 410 may trap heat and may be hot spot(s) in the package structure 20. For example, the first package component 400 is a chip-on-wafer package, although it should be appreciated that embodiments may be applied to other 3D semiconductor packages. The interposer 420 includes an interconnect structure (not shown) for electrically connecting the semiconductor dies 410. Although embodiments illustrated herein are discussed in the context of an interposer 120, it should be appreciated that other types of structures (e.g., a redistribution layer, a circuit substrate, a combination thereof, etc.) may be utilized for the first package component 400.

The first underfill layer UF1 is optionally formed between the semiconductor dies 410 and the interposer 420 to surround the die connectors attaching the semiconductor dies 410 to the interposer 420. The semiconductor dies 410 may be encapsulated in the insulating encapsulation 430 formed over the interposer 420. The insulating encapsulation 430 may be similar to the first insulating encapsulation 120 discussed above, so the detailed descriptions are omitted for brevity. In some embodiments, the outer sidewall of the insulating encapsulation 430 is substantially aligned with that of the interposer 420 after the singulation, thereby forming a coterminous sidewall of the first package component 400.

With continued reference to FIG. 4A, the first package component 400 is mounted on the second package component 500 through conductive connectors 425. For example, the second package component 500 includes bond pads 502 formed at one side and external terminals 504 formed at the opposing side. In some embodiments, conductive connectors 425 of the first package component 400 are electrically connected to conductive features of the interposer 420 and the bond pads 502 of the second package component 500. The conductive connectors 425 may be BGA connectors, solder balls, metal pillars, C4 bumps, micro bumps, ENEPIG bumps, or the like. The external terminals 504 may have greater dimension than that of the conductive connectors 425 and may be used to further connect additional device component (e.g., a PCB, a system board, another package structure, etc.). The second underfill layer UF2 is optionally formed between the first package component 400 and the second package component 500 to surround the conductive connectors 425. The second package component 500 may be a laminate package substrate, a built-up package substrate, or other suitable type of package substrate. In some embodiments, the first package component 400 combined with the second package component 500 is referred to a chip-on-wafer-on-substrate package, although it should be appreciated that other embodiments may be applied to other 3D semiconductor packages.

Still referring to FIG. 4A, the metallic layer 310 and the TIM layer 320 may be sequentially formed on the first package component 400, and then the heat dissipating component 330' is attached to the TIM layer 320. The structure in the dashed box outlined in FIG. 4A may be similar to the structure shown in FIG. 2C or FIG. 3, so the detailed descriptions are not repeated herein. In some embodiments, the material of the heat dissipating component 330' includes silicon, ceramic, metal, metal alloy, or other thermally conductive material(s). The heat dissipating component 330' may be a heat sink having a plurality of trenches and a plurality of fins between trenches, although it should be understood that other embodiments may be applied to other heat dissipating component.

Referring to FIG. 4B and with reference to FIG. 1I and FIG. 4A, a package structure 30 is similar to the package structure 10 shown in FIG. 1I, and the difference therebetween lies in that the package structure 30 further includes the fin-type of the heat dissipating component 330' attached to the lid-type of the heat dissipating component 330. For example, the TIM layer 320' is interposed between the fin-type of the heat dissipating component 330' and the lid-type of the heat dissipating component 330 for better adhesion and heat dissipation. It should be understood that the package structures described above is merely examples, and that variations thereof may be carried out while still remaining within the scope of the claims and disclosure.

In accordance with some embodiments, a package structure includes a first semiconductor die, a first insulating encapsulation, a thermal coupling structure, and a heat dissipating component. The first semiconductor die includes an active side, a rear side, and a sidewall connected to the active side and the rear side. The first insulating encapsulation extends along the sidewall of the first semiconductor die. The first insulating encapsulation includes a first side substantially leveled with the active side of the first semiconductor die, a second side opposite to the first side, and a plurality of topographic features at the second side. The thermal coupling structure includes a metallic layer overlying and the rear side of the first semiconductor die and the topographic features of the first insulating encapsulation. The heat dissipating component is thermally coupled to the first semiconductor die through the thermal coupling structure.

In accordance with some embodiments, a package structure includes a first package component, a thermal coupling structure disposed on the first package component, a second package component disposed below and electrically coupled to the first package component, and a heat dissipating component disposed on the second package component and covering the first package component. The first package component includes a semiconductor die and an insulating encapsulation laterally surrounding the semiconductor die. The insulating encapsulation includes a base layer and a plurality of fillers partially embedded in the base layer. The thermal coupling structure includes a metallic layer overlying the semiconductor die and extends to cover the fillers that are accessibly revealed by the base layer. The thermal coupling structure is interposed between the heat dissipating component and the first package component.

In accordance with some embodiments, a manufacturing method of a package structure includes at least the following steps. A first package component is formed over a temporary carrier, where the first package component includes a semiconductor die encapsulated by an insulating encapsulation material that includes a base layer and a plurality of fillers inside the base layer. The temporary carrier is de-bonded to expose a rear side of the semiconductor die, and during the de-bonding, a portion of the fillers is accessibly revealed from the base layer to form an insulating encapsulation. A metallic layer is formed on the rear side of the semiconductor die and the portion of the fillers of the insulating encapsulation. A heat dissipating component is coupled to the first package component at least through the metallic layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first semiconductor die comprising an active side, a rear side, and a sidewall connected to the active side and the rear side;
   a first insulating encapsulation extending along the sidewall of the first semiconductor die, the first insulating encapsulation comprising a first side substantially leveled with the active side of the first semiconductor die, a second side opposite to the first side, and a plurality of topographic features at the second side;
   a thermal coupling structure comprising a metallic layer, the metallic layer directly contacting the rear side of the first semiconductor die and the topographic features of the first insulating encapsulation; and
   a heat dissipating component thermally coupled to the first semiconductor die through the thermal coupling structure.

2. The package structure of claim 1, wherein the first insulating encapsulation comprises a base layer and a plurality of fillers, and a portion of fillers protruding from the base layer is the topographic features that are covered by the metallic layer of the thermal coupling structure.

3. The package structure of claim 1, wherein the metallic layer of the thermal coupling structure overlying the first insulating encapsulation substantially conforms to a surface topography of the topographic features.

4. The package structure of claim 1, wherein a portion of the sidewall of the first semiconductor die is covered by the metallic layer of thermal coupling structure.

5. The package structure of claim 4, wherein a thickness of a portion of the metallic layer overlying the rear side of the first semiconductor die is greater than or substantially equal to a thickness of another portion of the metallic layer lining the portion of the sidewall of the first semiconductor die.

6. The package structure of claim 1, wherein the thermal coupling structure further comprises a thermal interface material (TIM) layer interposed between the metallic layer and the heat dissipating component, and a thickness of a portion of the TIM layer that is above the first semiconductor die is substantially less than a thickness of another portion of the TIM layer that is above the first insulating encapsulation.

7. The package structure of claim 1, further comprising:
   a second semiconductor die disposed next to the first semiconductor die, and the first insulating encapsulation laterally surrounding the first and second semiconductor dies;
   a redistribution structure covering the active side of the first semiconductor die, a first side of the first insulating encapsulation, and an active side of the second semiconductor die;
   a third semiconductor die disposed on a side of the redistribution structure opposite to the first and second semiconductor dies, wherein the first and second semiconductor dies are electrically interconnected through the third semiconductor die and the redistribution structure; and
   a second insulting encapsulation laterally covering the third semiconductor die.

8. The package structure of claim 1, further comprising:
   a circuit substrate disposed below and electrically coupled to the first semiconductor die, wherein the heat dissipating component comprises a lid disposed on the circuit substrate to contain the first semiconductor die therein.

9. A package structure, comprising:
   a first package component comprising:
      a semiconductor die; and
      an insulating encapsulation laterally surrounding the semiconductor die, the insulating encapsulation comprising a base layer and a plurality of fillers partially embedded in the base layer;
   a thermal coupling structure disposed on the first package component, the thermal coupling structure comprising a metallic layer overlying the semiconductor die and extending to cover the fillers that are accessibly revealed by the base layer;
   a second package component disposed below and electrically coupled to the first package component; and
   a heat dissipating component disposed on the second package component and covering the first package component, and the thermal coupling structure being interposed between the heat dissipating component and the first package component.

10. The package structure of claim 9, wherein the metallic layer of the thermal coupling structure substantially conforms to a surface topography of the insulating encapsulation.

11. The package structure of claim 9, wherein the insulating encapsulation comprises a first side substantially leveled with an active side of the semiconductor die, and a second side opposite to the first side and rougher than a rear side of the semiconductor die.

12. The package structure of claim 9, wherein:
   the thermal coupling structure further comprises a thermal interface material (TIM) layer interposed between the metallic layer and the heat dissipating component, and
   an interface between a portion of the TIM layer and a portion of the metallic layer overlying the insulating encapsulation is substantially rougher than an interface between another portion of the TIM layer and a portion of the metallic layer overlying the semiconductor die.

13. The package structure of claim 9, wherein a sidewall of the semiconductor die comprises a major portion covered by the insulating encapsulation, and a minor portion covered by the metallic layer of the thermal coupling structure.

14. A package structure, comprising:
   a semiconductor die;
   an insulating encapsulation laterally covered the semiconductor die;

a thermal coupling structure disposed on the semiconductor die and the insulating encapsulation, the thermal coupling structure comprising a metallic layer overlying a rear surface of the semiconductor die and conformally covering a roughed surface of the insulating encapsulation; and a heat dissipating component disposed on the thermal coupling structure and thermally coupled to the semiconductor die through the thermal coupling structure.

15. The package structure of claim 14, wherein the insulating encapsulation comprises a base layer and fillers in the base layer, and a portion of fillers protruding from the base layer forms the roughed surface of the insulating encapsulation.

16. The package structure of claim 14, wherein an upper sidewall of the semiconductor die connected to the rear surface of the semiconductor die is directly covered by the metallic layer of thermal coupling structure.

17. The package structure of claim 14, wherein the thermal coupling structure further comprises a thermal interface material (TIM) layer interposed between the metallic layer and the heat dissipating component.

18. The package structure of claim 17, wherein a first portion of an interface between the metallic layer and the TIM directly above the semiconductor die is smoother than a second portion of the interface directly above the insulating encapsulation.

19. The package structure of claim 14, further comprising:
an interposer disposed below the semiconductor die and the insulating encapsulation, the semiconductor die being electrically coupled to the interposer.

20. The package structure of claim 19, further comprising:
a package substrate disposed below and electrically coupled to the interposer.

* * * * *